US 6,204,167 B1

(12) United States Patent
Taniguchi

(10) Patent No.: US 6,204,167 B1
(45) Date of Patent: Mar. 20, 2001

(54) METHOD OF MAKING A MULTI-LEVEL INTERCONNECT HAVING A REFRACTORY METAL WIRE AND A DEGASSED OXIDIZED, TIN BARRIER LAYER

(75) Inventor: Toshio Taniguchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/159,601

(22) Filed: Sep. 24, 1998

Related U.S. Application Data

(62) Division of application No. 08/502,894, filed on Jul. 17, 1995.

(30) Foreign Application Priority Data

Aug. 31, 1994 (JP) .................................. 6-207031

(51) Int. Cl.[7] ................ H01L 21/4763; H01L 21/44; H01L 23/48; H01L 23/52; H01L 29/40
(52) U.S. Cl. ................ 438/627; 438/625; 438/648; 438/653; 438/656; 438/685; 438/927; 257/751
(58) Field of Search .................. 438/627, 625, 438/648, 653, 656, 685, 660, 927

(56) References Cited

U.S. PATENT DOCUMENTS

| | | | |
|---|---|---|---|
| 4,566,026 | 1/1986 | Lee et al. | 257/763 |
| 4,937,652 | 6/1990 | Okumura et al. | 257/754 |
| 5,049,975 | 9/1991 | Ajika et al. | 257/751 |
| 5,055,908 | 10/1991 | Fuller et al. | 257/764 |
| 5,202,579 | 4/1993 | Fujii et al. | 257/751 |
| 5,278,448 * | 1/1994 | Fujii | 257/750 |
| 5,306,952 | 4/1994 | Matsuura et al. | 257/765 |
| 5,341,026 | 8/1994 | Harada et al. | 257/765 |
| 5,378,660 * | 1/1995 | Ngan et al. | 437/247 |
| 5,416,045 * | 5/1995 | Kauffman et al. | 437/174 |
| 5,416,359 | 5/1995 | Oda | 257/764 |
| 5,479,053 | 12/1995 | Oda | 257/764 |
| 5,589,713 | 12/1996 | Lee et al. | 257/751 |
| 5,627,391 | 5/1997 | Shimada et al. | 257/751 |
| 5,686,761 | 11/1997 | Huang et al. | 257/751 |
| 5,726,497 * | 3/1998 | Chao et al. | 257/758 |
| 5,976,969 * | 11/1999 | Lin et al. | 438/629 |

FOREIGN PATENT DOCUMENTS

| | | | |
|---|---|---|---|
| 61-133646 * | 6/1986 | (JP) | H01L/21/88 |
| 62-118525 | 5/1987 | (JP). | |
| 62-213159 | 9/1987 | (JP). | |

* cited by examiner

Primary Examiner—Wael Fahmy
Assistant Examiner—Neal Berezny
(74) Attorney, Agent, or Firm—Arent Fox Kintner Plotkin & Kahn, PLLC

(57) ABSTRACT

A multi-level wiring structure having: a first wiring formed on an insulating surface, the first wiring containing refractory metal as a main composition thereof; an inter-level insulating film formed to cover the first wiring and having a contact hole at a predetermined region of the first wiring; a second wiring formed over said inter-level insulating film to be electrically connected to an upper surface of the first wiring at a region of the contact hole, the second wiring containing Al as a main composition thereof; and a barrier layer disposed at an interface where the first and second wirings are electrically connected, the barrier layer being made of a material different from, and substantially not reacting with, both Al and the refractory metal constituting the main composition of the first wiring. It is possible to suppress an increase of contact resistance between an upper level wiring and a lower level wiring even if refractory metal is used as the lower level wiring and heat treatment is performed after the upper level wiring is formed.

24 Claims, 9 Drawing Sheets

METHOD OF MAKING A MULTI-LEVEL INTERCONNECT HAVING A REFRACTORY METAL WIRE AND A DEGASSED OXIDIZED, TIN BARRIER LAYER

This application is a divisional application filed under 37 CFR §1.53(b) of parent application Ser. No. 08/502,894, filed Jul. 17, 1995.

BACKGROUND OF THE INVENTION a) Field of the Invention

The present invention relates to a semiconductor device having multi-level wirings and a method of manufacturing the same, and more particularly to a technique of forming multi-layer wirings using refractory metal as a lower level wiring.

b) Description of the Related Art

In a conventional semiconductor device, Al or Al alloy has been mainly used as a stack or layered wiring. Used as a laminate wiring are, for example, an Al/TiN/Ti stack structure having an Al layer and an TiN layer on a Ti layer in this order from the top and an Al/TiN stack structure having an Al layer on the TiN layer. An Al/TiN/Ti stack structure has been generally used particularly for a lower level wiring. In this specification, A/B means that an A layer is stacked upon a B layer.

As semiconductor devices are miniaturized more and more, a wiring width, a contact hole diameter, and the like have become smaller particularly at a lower level wiring. As the pattern size becomes fine, a density of current flowing through an Al wiring increases and electromigration in the Al wiring is likely to cause a resistance increase and a wiring open failure. There is therefore some fear of lowered reliability of semiconductor devices.

Degraded performance such as low endurance or resistance to stress migration caused by fine patterns have also increased reliability concerns.

In order to solve the above problems, attention has been paid to a technique of using refractory metal tungsten (W) instead of Al as a lower level wiring.

FIG. 8 is a cross sectional view of a substrate with a multi-level wiring structure having a similar structure to a conventional Al multi-level wiring structure and using an W layer as a lower level wiring. On a silicon substrate 50, a boro-phospho-silicate glass (BPSG) film 51 is formed. A Ti film 52, a TiN film 53, and a W film 54 are deposited on a predetermined surface area of the BPSG film 51 in this order from the bottom to form a lower level wiring. The lower level wiring is electrically connected to a silicon substrate 50 or a polycrystalline silicon electrode at a contact region (not shown) through a contact hole formed in the BPSG film 51.

An inter-level insulating film 55 is formed on the lower level wiring and the BPSG film 51. A connection or via hole is formed in the inter-level insulating film 55 for electrical connection to the lower level wiring. An upper level wiring of a stack or laminate structure having a Ti layer 56 and an Al alloy layer 57 thereon is formed on the inter-level insulating film 55. The upper level wiring is electrically connected to the lower level wiring through the connection hole formed in the inter-level insulating layer 55.

With the multi-level wiring structure shown in FIG. 8, contact resistance between the Al alloy layer 57 and W layer 54 increases because of heating during the formation of a passivation film after forming the upper level wiring or because of heating during annealing.

SUMMARY OF THE INVENTION

It is an object of the present invention to provide a multi-level wiring forming technique capable of suppressing an increase of contact resistance between an upper level wiring and a lower level wiring even if refractory metal is used as the lower level wiring and a heat treatment is performed after the upper level wiring is formed.

According to one aspect of the present invention, there is provided a semiconductor device comprising: an underlie having a first insulating layer; a first wiring containing refractory metal as a main composition thereof and formed on said first insulating layer; a second insulating layer formed on said first wiring and having a contact hole on a desired region of the first wiring; a second wiring containing Al as a main composition thereof and formed on said second insulating layer to be electrically connected to an upper surface of said first wiring at a region of said contact hole; and a barrier layer formed between said first and second wirings at a portion where said first and second wirings are electrically connected, said barrier layer being made of a material different from, and substantially not reacting with, both Al and the refractory metal.

The term "main composition" means a composition of 90% or more, and typically a composition of 98% or more. The term "not substantially reacting" means a degree of reactivity giving no significant change in contact resistance between the first and second wirings. If reaction occurs between a barrier layer and an upper or lower level wiring layer, the contact resistance therebetween usually increases two or three times as large as that immediately after forming the wirings, at the completion of all the processes.

According to another aspect of the present invention, there is provided a method of manufacturing a semiconductor device, comprising the steps of: forming a first wiring on a substrate having a first insulating layer on a surface thereof, said first wiring containing refractory metal as a main composition thereof; forming a second insulating layer on said first wiring; forming a via hole in said second insulating layer so as to expose a surface of said first wiring; forming a barrier layer at least on the exposed surface of said first wiring at a bottom of said via hole, said barrier layer being made of a material different from, and not substantially reacting with, both Al and, the refractory metal; slightly oxidizing a surface of said barrier layer to form an oxidized surface layer; and forming a second wiring layer on said second insulating film and said oxidized surface layer, said second wiring layer containing Al as a main composition thereof.

An increase of contact resistance between the first wiring of refractory metal and the second wiring of Al or Al alloy may be ascribed to reaction between refractory metal and Al. A barrier layer is formed at an interface between the first wiring or refractory metal and the second wiring of Al or Al alloy to be formed on the first wiring, the barrier layer being made of a material not substantially reacting with both the refractory metal and Al or Al alloy. In this manner, an increase of contact resistance between the first and second wirings, which would otherwise be caused by reaction between the first and second wiring materials, can be prevented. The barrier layer may scarcely or slightly react with the first and second wirings, provided that the adverse effects by byproduct can be neglected and a non-reacted barrier layer is left.

Prior to forming an Al alloy layer of the second wiring layer on the barrier layer, a thin oxidized surface layer is formed on the barrier layer. If an Al alloy layer of the second wiring layer is directly formed on the barrier layer, resistance to electromigration in the second wiring layer is lowered. However, by forming a thin oxidized surface layer on the barrier layer, it is possible to prevent resistance to electromigration from being lowered.

As above, an increase of contact resistance between a first wiring layer of refractory metal and a second wiring layer formed on the first wiring layer can be suppressed and the reliability and performance of semiconductor devices can be improved.

DETAILED DESCRIPTION OF THE PREFERRED EMBODIMENTS

A method of manufacturing multi-level wirings according to an embodiment of the invention will be described with reference to FIGS. 1A to 1G. For the description of each process, FIGS. 2A to 6B are referred to when necessary.

Figure 1A:
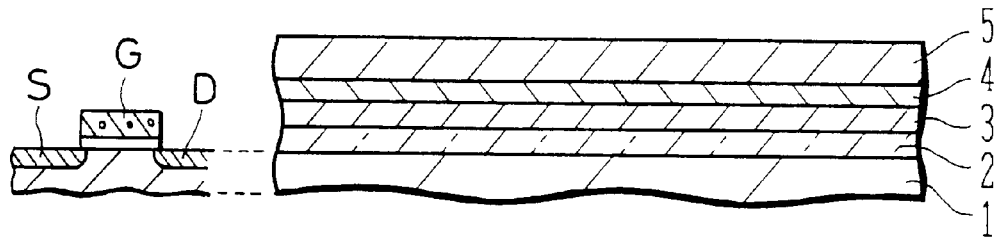
FIGS. 1A to 1G are cross sectional views of a multi-level wiring structure illustrating a method of forming multi-level wirings according to an embodiment of the invention.

FIG. 1A shows a cross section of a substrate with a stack structure from which a lower level wiring is formed. A silicon substrate 1 is covered with a boro-phospho-silicate glass (BPSG) film 2 formed on the surface thereof. The silicon substrate 1 has active regions formed at other regions thereof as shown at a left part of the figure, where MOS transistors, each having a source S, a gate G and a drain D, are formed.

On the BPSG film 2 on the substrate 1, a Ti layer 3 of 20 nm thick, a TiN layer 4 of 50 nm thick are formed in this order by sputtering. Next, a W layer 5 of 350 nm thick is formed over the whole surface of the TiN layer 4 by chemical vapor deposition (CVD) using $WR_6$ as source gas and $H_2$ as reducing gas.

Figure 1B:
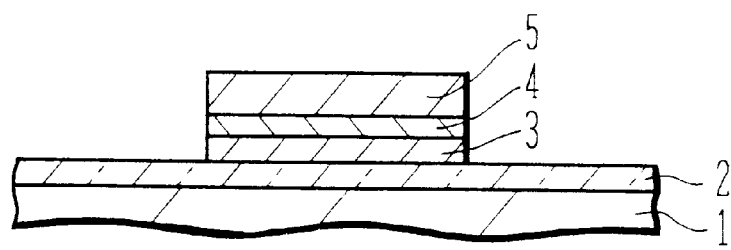

As shown in FIG. 1B, regions other than a predetermined wiring region of the W layer 5, TiN layer 4, and Ti layer 3 are etched off by photolithography to form a lower level wiring.

Figure 1C:
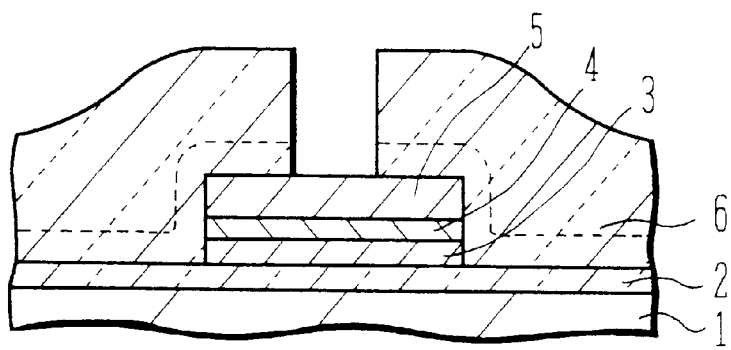

As shown in FIG. 1C, an inter-level insulating layer or film 6 or 700 to 900 nm thick is formed on the surface of the lower level wiring and the BPSG film 2. The inter-level insulating layer 6 is a stack of an SiON film of 100 nm thick and a non-doped $SiO_2$ film of 600 to 800 thick. The SiON film is formed by CVD using $SiH_4$ and $N_2O$ as source gas, and the $SiO_2$ film is formed by CVD using tetra-ethoxy-silane (TEOS).

Next, a via hole is formed by photolithography in the inter-level insulating film 6 at its partial area within the region of the lower level wiring, the via hole being used for electrical connection between the layer level wiring and an upper level wiring.

Figure 1D:
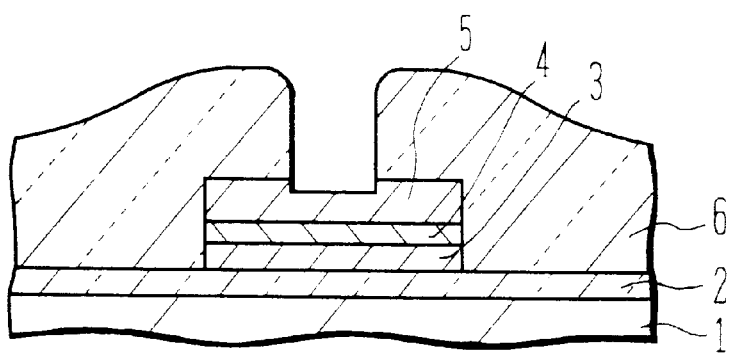

As shown in FIG. 1D, the exposed surface of the W layer 5 is subjected to a pre-cleaning process. The pre-cleaning process sputter-etches the exposed surface of the W layer 5 by a thickness of 30 to 50 nm by using Ar. Although an etch of about 10 nm is sufficient for an ordinary pre-cleaning process, an etch of 30 to 50 nm is made so that the inter-level insulating film 6 is etched thicker. The upper corner of the via hole is therefore rounded. Since the peripheral area of the via hole opening surface becomes a gentle shape, step coverage of a successively formed wiring layer improved.

Figure 2A:
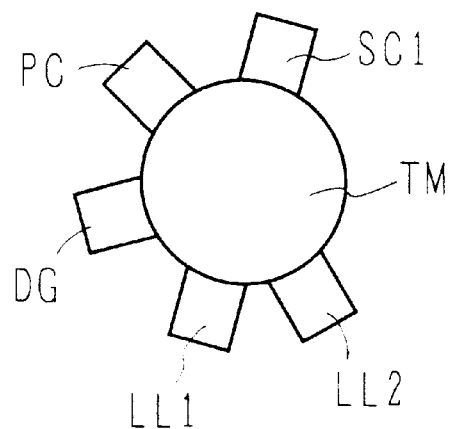
FIGS. 2A and 2B are a schematic plan view of a system for performing a preliminary cleaning process and TiN sputtering, and a graph showing a time dependent change in amount of degas from an inter-level insulating film when the substrate with a wiring structure shown in FIG. 1D is heated.

FIG. 2A shows an example of a system used for the pre-cleaning process and succeeding TiN layer sputtering. Load lock chambers LL1 and LL2 communicate through a transport module TM with a degas chamber DG, a pre-cleaning chamber PC, and a TiN sputtering chamber SC1. The degas chamber DG has an wafer orientator. A wafer is transported from the load lock chamber LL1 to the pre-cleaning chamber PC through the degas chamber DG, and subjected to a pre-cleaning process. Thereafter, the wafer is transported to the TiN sputtering chamber SC1 in a same vacuum atmosphere.

Figure 1E:
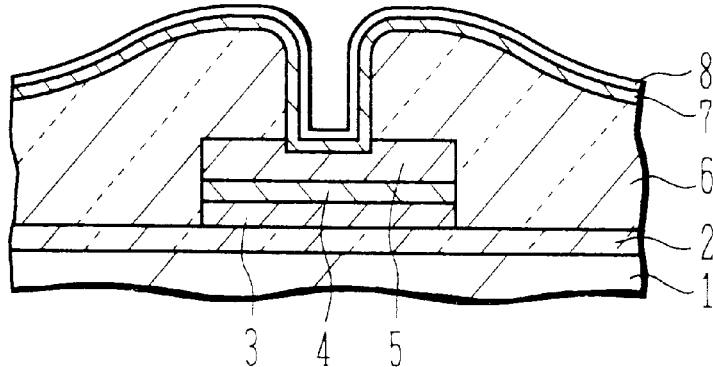

As shown in FIG. 1E, a TiN layer 7 of 100 nm thick is formed on the inter-level insulating film 6 and the exposed bottom surface of the via hole, by reactive sputtering using a Ti target in a mixed gas atmosphere of Ar and $N_2$ at a substrate temperature of 500° C.

On forming the TiN layer 7 at a substrate temperature of 500° C. by reactive sputtering, it is preferable to start TiN deposition before the substrate temperature rises significantly. In the following, a start time suitable for TiN deposition will be described with reference to FIG. 2B.

Figure 2B:
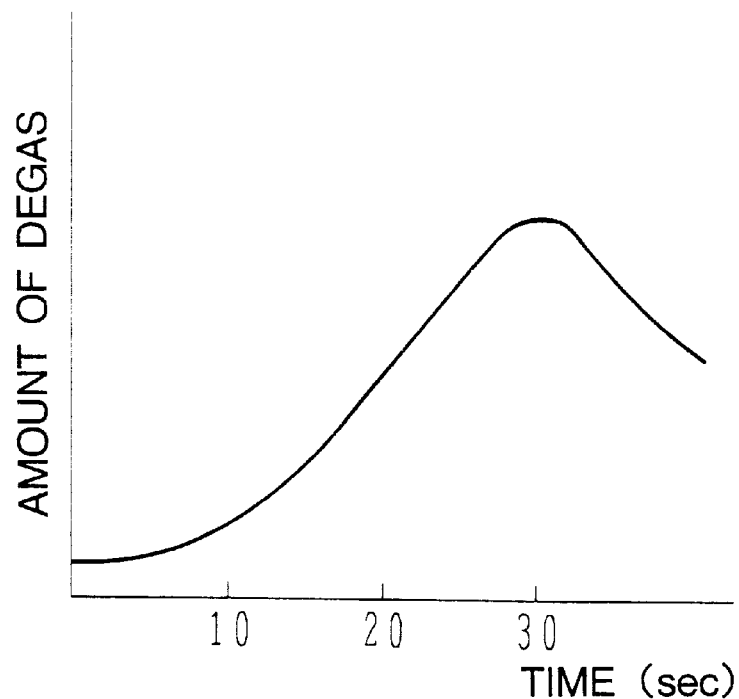

FIG. 2B is a graph showing a time dependent change in amount of degas from an inter-level insulating film 6. The abscissa represents a time lapse after the start of heating the substrate in the unit of second, and the ordinate represents amount of degas from the inter-level insulating layer 6 in an arbitrary scale. The amount of degas is small at the initial stage of temperature rise, and as the time lapses, it increase. The increase in the amount of degas becomes large particularly after the lapse of about 10 seconds after the start of heating. The amount of degas becomes maximum after the lapse of about 30 seconds after the start of heating, and thereafter it gradually reduces.

Degas from the inter-level insulating film contaminates the surface of the W layer 5 although it has been previously subjected to the pre-cleaning process. Therefore, contact resistance between the W layer 5 and TiN layer 7 increases. In order to suppress an increase of contact resistance, deposition of the TiN layer 7 is started before the amount of degas from the inter-level insulating layer 6 increases significantly. As seen from FIG. 2B, it is desired to start deposition of the TiN layer 7 within 10 seconds after the start of heating. In terms of the substrate temperature, it is desired to start deposition of the TiN layer 7 at a substrate temperature of 200° C. or lower.

In order to have the sufficient effects of substrate heating, it is preferable to start deposition of the TiN layer after a lapse of 5 seconds or longer after the start of heating. In terms of the substrate temperature, it is desired to start deposition of the TiN layer 7 at a substrate temperature of 50° C. or higher. The surface temperature of the TiN layer 7 at the end of deposition is preferably about 400 to 600° C., and more preferably about 500° C.

Thereafter, the wafer is taken out of the sputtering chamber SC1 and exposed once in the air, and then transported into a vertical furnace. The wafer is subjected to a heat treatment for 30 minutes at a temperature of 450° C. in an $N_2$ atmosphere to lightly oxidize the surface thereof by such oxygen attached to the surface of the substrate in the air and by such oxygen mixed into the furnace during transport of the substrate. In this manner, a very thin oxidized surface layer is formed on the surface of the TiN layer 7.

Next, the reason of slightly oxidizing the surface of the deposited TiN layer 7 will be described.

Figure 3:
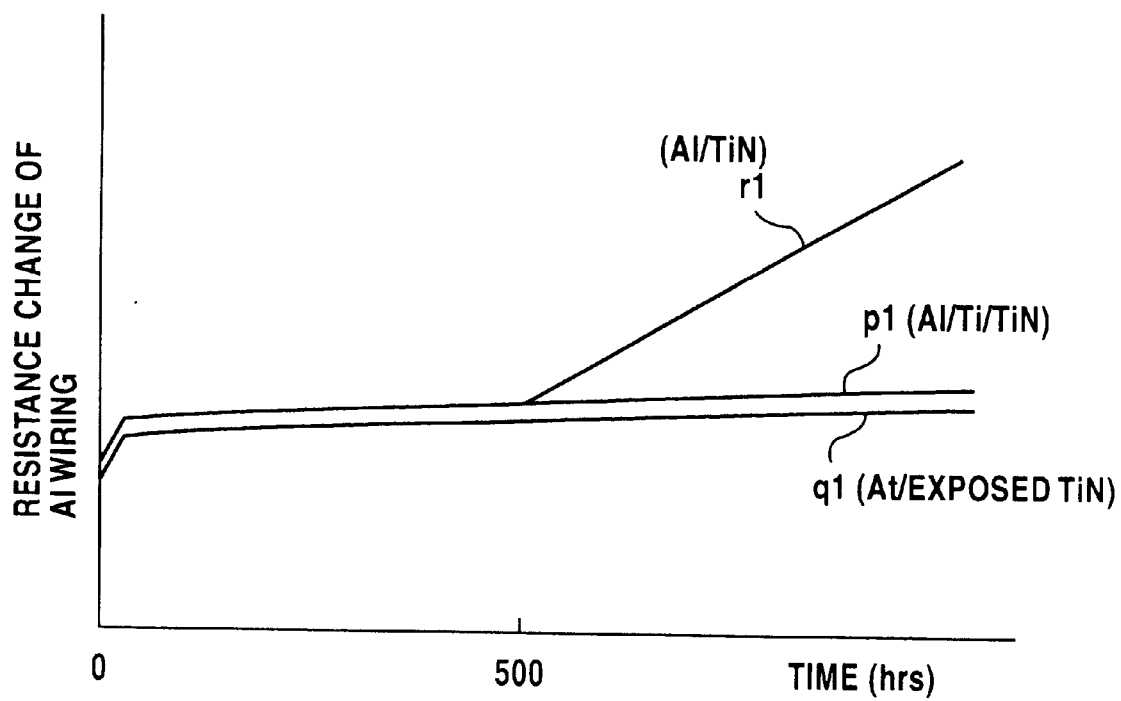
FIG. 3 is a graph showing time dependent resistance changes when current is supplied through wiring structure after the Al alloy layer is successively formed immediately after a TiN layer is formed, after the Al alloy layer is formed after the TiN layer is once exposed to the air, and after the Al alloy layer is formed on a Ti/TiN stack structure.

FIG. 3 shows a time dependent change in resistance of Al wiring formed on a TiN layer or on a Ti layer. The abscissa represents a lapse time in seconds after the start of flowing current, and the ordinate represents resistance of an Al wiring in arbitrary scale. The width of an Al wiring is 0.7 $\mu$m, the thickness thereof is 0.8 $\mu$m, a current density is 2 to 3 $MA/cm^2$, and a substrate temperature is 200° C.

In FIG. 3, a curve p1 stands for an Al wiring formed on a Ti layer which in turn is formed on a TiN layer (Ti/TiN layer), a curve q1 stands for an Al wiring layer formed on a TiN layer once exposed to the air, and a curve r1 stands for an Al layer successively formed on a TiN layer without exposing the latter in the air.

As seen from the curves p1 and q1, in the case of the Al wiring formed on the Ti/TiN layer or formed on the TiN layer after the TiN layer is once exposed in the air, although resistance slightly increases at the start of flowing current, it increases rarely thereafter. In contrast, as seen from the curve r1, in the case of the Al wiring successively formed on the TiN, an increase rate of resistance becomes great after a lapse of about 500 hours after the start of flowing current. This resistance increase may be considered to result from electromigration in the Al wiring.

Accordingly, in order to suppress an increase of resistance of the Al wiring, it is preferable to slightly oxidize the surface by exposing it to the air or subjecting it to a heat treatment after the TiN layer is formed. The thickness of an oxidized surface layer is 5 to 10 nm. Improved resistance against electromigration may be ascribed to large grain sizes of an Al wiring formed on the oxidized surface layer.

A method of forming an Al wiring on the Ti/TiN layer will be later described with reference to another embodiment.

Figure 1F:
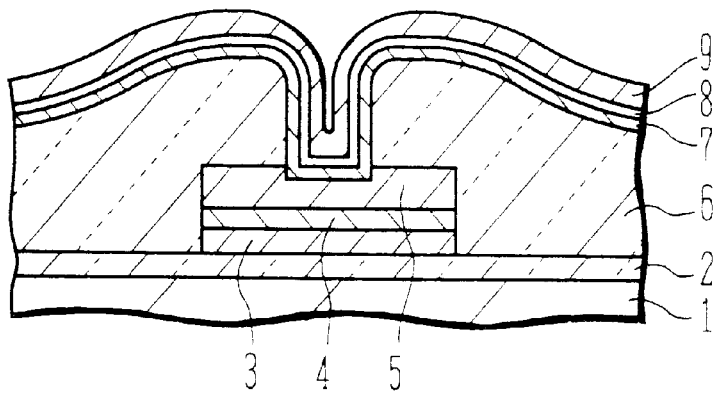

As shown in FIG. 1F, an Al alloy layer 9 is formed on the oxidized TiN surface layer 8. A method of forming the Al alloy layer 9 will be described.

Figure 4A:
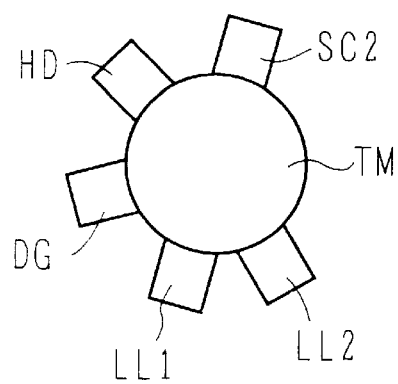
FIGS. 4A to 4C are a schematic plan view of a system for performing degas and Al deposition to be used in the embodiment, a schematic cross sectional view of a degas process system used in the embodiment, and a graph showing a change in the temperature of a substrate heated by lamp and by the degas process system of FIG. 4B.

FIG. 4A shows a system for sputtering the Al alloy layer 9. Load lock chambers LL1 and LL2 communicate through a transport module TM with a degas and orientator chamber DG, a heater degas chamber HD, and an Al sputtering chamber SC2.

After the surface of the TiN layer 7 is oxidized, the substrate is first heated to 500° C. for degassing. After the oxidized TiN surface layer is formed in a vertical furnace, the wafer is exposed in the air and transported to the system shown in FIG. 4A. The wafer is first transported from the load lock chamber LL1 to the degas chamber DG through the transport module TM, and the orientation of the wafer is adjusted. Next, the wafer is transported through the transport module TM to the heater degas chamber HD whereat it is heated by a heater to 500° C. In this manner, water contents adsorbed on the oxidized TiN surface layer can be removed.

Figure 4B:
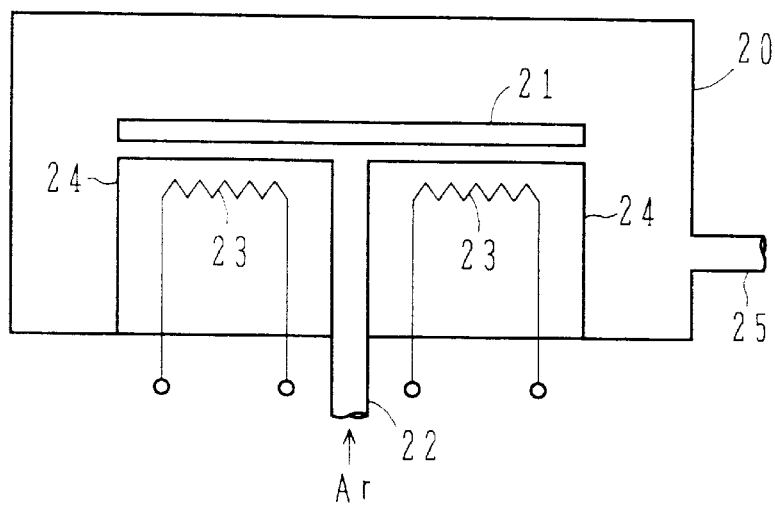

FIG. 4B shows a heater of the heater degas chamber for degassing. On the bottom of the process chamber 20, a susceptor 24 with a flat upper plane is disposed. A heater 23 is housed within the susceptor 24. A gas pipe 22 for introducing gas into the process chamber 20 is open at the upper plane of the susceptor 24 generally at the central area thereof. A gas exhaust pipe 25 communicates with the process chamber to exhaust inner gas.

A substrate 21 to be processed is disposed generally in parallel with the upper plane of the susceptor 24 at the position slightly above the susceptor 24. While the upper plane of the susceptor 24 is heated by the heater 23, Ar gas is introduced from the gas pipe 22. Ar gas flows through a gap between the susceptor 24 and the substrate 21 and is heated by the susceptor 24. It is preferable to set the inside of the process chamber to a high vacuum degree and to set the pressure at the gap to about 1 to 20 Torr. The lower surface of the substrate is heated by hot Ar gas to a desired temperature.

Figure 4C:
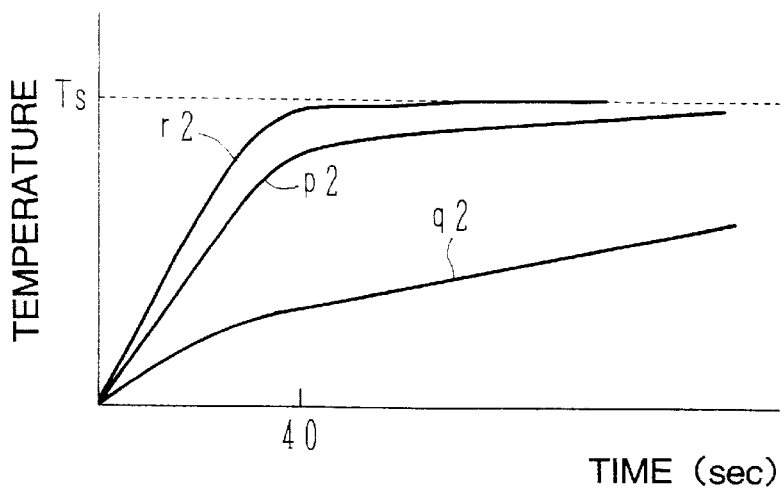

FIG. 4C is a graph showing a change in temperature at the surface of a heated substrate. The abscissa represents a lapse of time after the start of heating in the unit of second, and the ordinate represents a temperature of the surface of a heated substrate in arbitrary scale. A curve p2 was obtained by heating a substrate in the process chamber shown in FIG. 4B. A curve q2 was obtained by heating a substrate with a lamp. A curve r2 was obtained by heating a substrate with a lamp, when a TiN film is not formed on the surface of the substrate. As seen from the curves q2 and r2 obtained by heating the substrates with a lamp, although the heating effects exist if a TiN layer is not formed on the surface of the substrate, the heating effects are small if a TiN layer is formed on the substrate and it takes a long time to heat the substrate to a desired temperature.

In contrast to the above, if the substrate is heated by heating medium of Ar gas which flows along the bottom surface of the substrate as illustrated in FIG. 4B, the substrate can be heated to a desired temperature in a relatively short time irrespective of whether a TiN layer is formed on the substrate or not. A desired temperature is almost obtained after about 40 seconds after the start of heating. If the substrate is to be heated in the process chamber shown in FIG. 4B, it is preferable to degas in about 60 seconds after the start of heating. If degas of water is to be performed sufficiently, it is preferable to set the temperature of the surface of the TiN layer (oxidized TiN surface layer) to 250 to 500° C.

Thereafter, the wafer is transported from the heater degas chamber HD to the Al sputtering chamber SC2 in the same vacuum atmosphere to form an Al alloy layer by sputtering. The Al alloy is an alloy containing Al of 90% or more (typically 98% or more) mixed with Si, Cu, T, and/or other elements.

By sputtering the Al alloy layer 9 in the same vacuum atmosphere after the TiN layer 7 and oxidized TiN surface layer 8 are sufficiently degassed as in the above manner, it is possible to prevent the Al alloy layer 9 from being subsided at a later heat treatment.

Figure 5A:
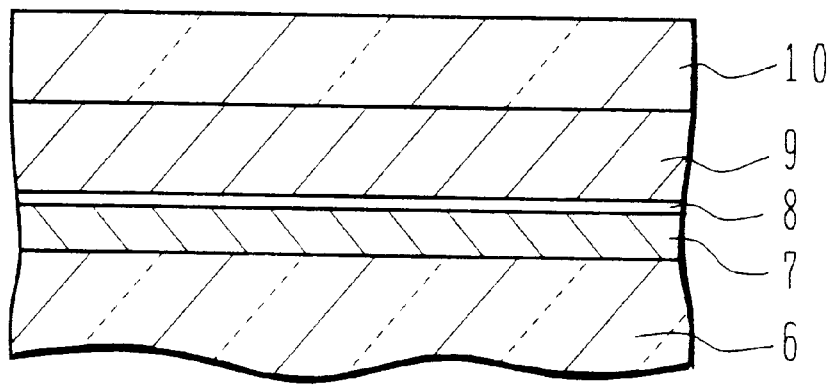
FIGS. 5A and 5B are cross sectional views of a stack structure illustrating the state of subsidence of an Al alloy layer formed on a TiN layer.
Figure 5B:
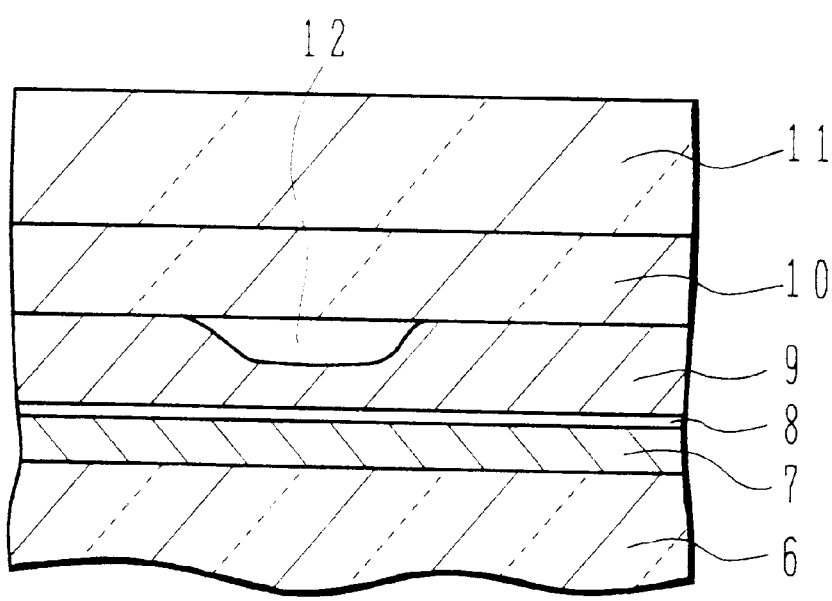

FIGS. 5A and 5B are cross sectional views of a stack structure when the TiN layer 7 and oxidized TiN surface layer 8 are not sufficiently degassed.

As shown in FIG. 5A, an inter-level insulating layer 6, a TiN layer 7, and an oxidized TiN surface layer 8 are formed by the similar processes illustrated in FIGS. 1A to 1E. An Al alloy layer 9 is formed on the oxidized TiN surface layer 8 without degassing. A phospho-silicate glass (PSG) film 10 is formed on the Al alloy layer 9.

As shown in FIG. 5B, an SiN layer 11 is formed on the PSG layer 10 as a passivation film. At this time, part of the Al alloy layer 9 subsides and a subsided portion 12 is formed. This subsided portion 12 may be ascribed to water adsorbed to the surfaces of the TiN layer 7 and oxidized TiN surface layer 8. Generation of such subsidence can be avoided by sufficient degassing prior to forming the Al alloy layer 9.

After the completion of degassing, the temperature of the susceptor 24 shown in FIG. 4B is lowered to about 50 to 200° C., more preferably to about 100° C. Cool Ar gas is flowed through the susceptor to cool the substrate to 50 to 200° C. Thereafter, the wafer is transported to the Al sputtering chamber SC2. A susceptor like the susceptor 24 shown in FIG. 4B is also disposed in the sputtering chamber SC2. An Al alloy layer is formed at a substrate temperature of about 350° C. and a deposition speed of 10 nm/s to a thickness of 0.4 to 0.5 $\mu$m, thereafter at a deposition speed of 20 nm/s to the final thickness of 0.8 to 1.0 $\mu$m. At the first deposition state, Ar gas is not supplied to the susceptor to suppress a rise of the substrate temperature. A rise of the substrate temperature can also be suppressed by setting the preceding deposition speed lower than the succeeding deposition speed. The Al alloy layer is made of Al mixed with 0.1% Cu and 0.15% Ti.

As above, it is preferable to lower the substrate temperature to about 300 to 400° C. when the Al alloy layer is deposited after the oxidized TiN surface layer 8 is degassed at a temperature of about 250 to 500° C., e.g., at about 500° C. Step coverage of the Al alloy layer can be improved by depositing the Al alloy layer at a substrate temperature of 300 to 400° C.

Figure 6A:
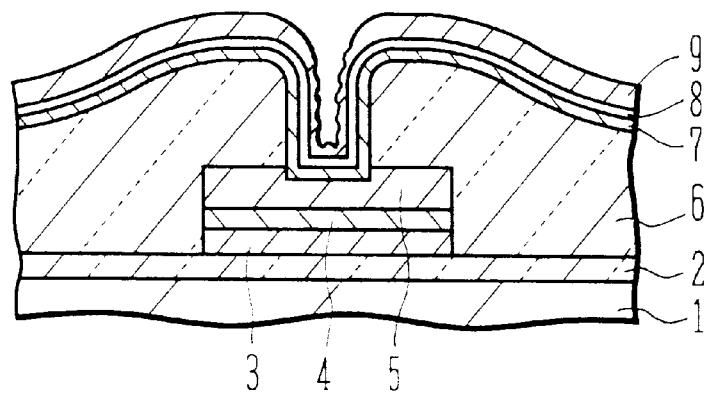
FIGS. 6A and 6B are a cross sectional view of a multi-level wiring structure with an Al alloy layer formed at a relatively high temperature on an oxidized surface of a TiN layer, and a schematic plan view of another system for manufacturing multi-level wirings.

FIG. 6A is a cross sectional view of a stack or laminate structure having an Al alloy layer 9 formed at a temperature of about 500° C. Al atom clusters attached to the surface of the substrate whose temperature is relatively high at about 500° C. tend to take round (or semi-spherical) shapes in order to reduce their surface areas. Therefore, as shown in FIG. 6A, the surface of the Al alloy layer 9 deposited on the side wall of a via hole becomes uneven and step coverage is degraded. The surface of the Al alloy layer 9 can be made smooth by setting the substrate temperature to about 300 to 400° C. before, and at the initial stage of the deposition of, the Al alloy layer 9.

Figure 6B:
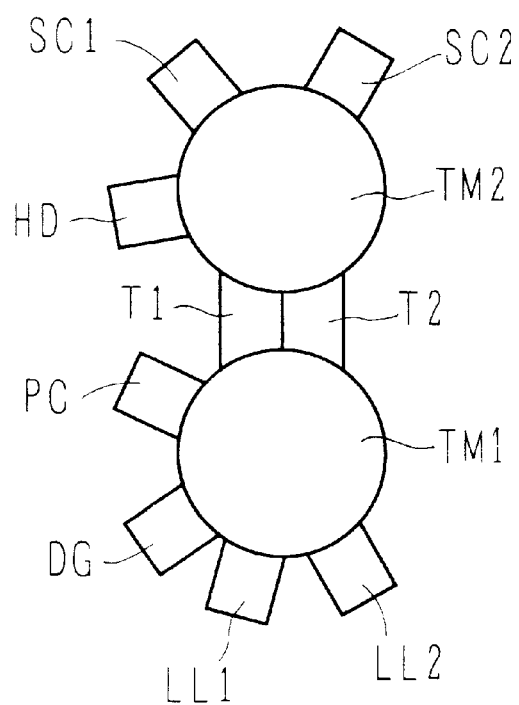

Instead of the system shown in FIGS. 2A and 4A, a system such as shown in FIG. 6B may be used. Transport modules TM1 and TM2 are coupled by transport passages T1 and T2. A degas (orientator) chamber DG and a pre-cleaning chamber PC are coupled to the transport module TM1 at its periphery. A pair of load lock chambers LL1 and LL2 allow simultaneous bi-directional transfer. A heater degas chamber HD, a TiN sputtering chamber SC1, and an Al sputtering chamber SC2 are coupled to the transport module TM2 at its periphery. By using this system, the processes illustrated in FIGS. 1D, 1E, and 1F can be performed. Since a wafer is not exposed in the air throughout any process, an intermediate degas process may be simplified or omitted.

In the above manner, an upper level wiring having a stack structure can be formed which is constituted by the Al alloy layer 9, an oxidized TiN surface layer 8, and a TiN layer 7.

Figure 1G:
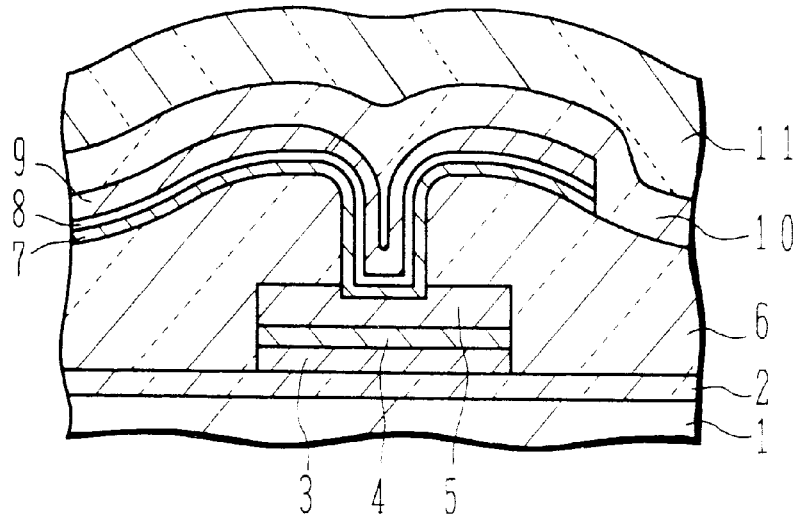

FIG. 1G is a cross sectional view of a wiring stack structure with a passivation film formed on the upper wiring stack structure.

After the Al alloy layer 9 is formed, the region where upper level wirings are formed is covered with a resist pattern. By using this resist pattern as a mask, the Al alloy layer 9, oxidized TiN surface layer 8, and TiN layer 7 are etched. Next, a PSC film 10 of 0.2 $\mu$m thick is formed over the whole surface of the substrate. Next, in order to remove damages generated during the formation of the PSG film, a heat treatment is performed at 450° C. for about 30 minutes in a forming gas atmosphere. As the forming gas, for example, a mixed gas of $N_2$ gas containing 3% $H_2$ is used. After the heat treatment, an SiN film 11 of 1.0 $\mu$m thick is formed. In the above manner, a passivation film is formed which is constituted by the PSG film 10 and SiN film 11.

The wiring stack structure formed in the above manner and shown in FIG. 1G has the TiN layer 7 sandwiched between the W layer 5 and Al alloy layer 9. It is therefore possible to prevent an increase of contact resistance by reaction between W and Al. As stated earlier, it is also possible to prevent an increase of contact resistance between the W layer 5 and TiN layer 7 by starting deposition of the TiN layer before the amount of degas from the inter-level insulating film 6 increases much.

Furthermore, resistance against electromigration in the Al alloy layer 9 formed on the TiN layer 7 can be improved by slightly oxidizing the surface of the TiN layer 7 to form a thin oxide layer 8.

Although the method of successively forming the Al alloy layer on the TiN layer has the demerit that resistance to electromigration in the Al alloy layer is lowered as seen from the curve r1 of FIG. 3, an effect can be expected, otherwise, in the context of preventing an increase of contact resistance by reaction between Al and W, because the TiN layer is formed between the Al alloy layer and W layer.

A Ti layer may be formed between the W layer 5 and TiN layer 7. For example, after the pre-cleaning process for the exposed surface of the W layer 5 is performed as illustrated in FIG. 1D, a Ti layer of 10 to 50 nm thick may be formed at a substrate temperature of 200 to 300° C., and thereafter a TiN layer of 50 to 150 nm thick may be formed at a substrate temperature of 200 to 400° C.

Next, an Al alloy layer may be formed by the method described with FIG. 1F without oxidizing the surface of the TiN layer.

The Ti layer formed under the TiN layer improves resistance to electromigration in the Al alloy layer. This improvement may be ascribed to an enhanced (1 1 1) orientation of the Al alloy layer by the presence of the Ti layer. This method does not need to oxidize the surface of the TiN layer before depositing the Al alloy layer. As compared to the methods described with FIGS. 1A to 1G, this method is more effective in that the number of processes is reduced.

By sufficiently degassing the TiN layer 7 before the Al alloy layer 9 is formed, subsidence of the Al alloy layer 9 can be prevented. By depositing the Al alloy layer 9 at a relatively low temperature of about 300 to 400° C., e.g., at about 350° C., step coverage of the Al alloy layer 9 can be improved.

Next, another embodiment of the invention will be described with reference to FIGS. 7A and 7B.

Figure 7A:
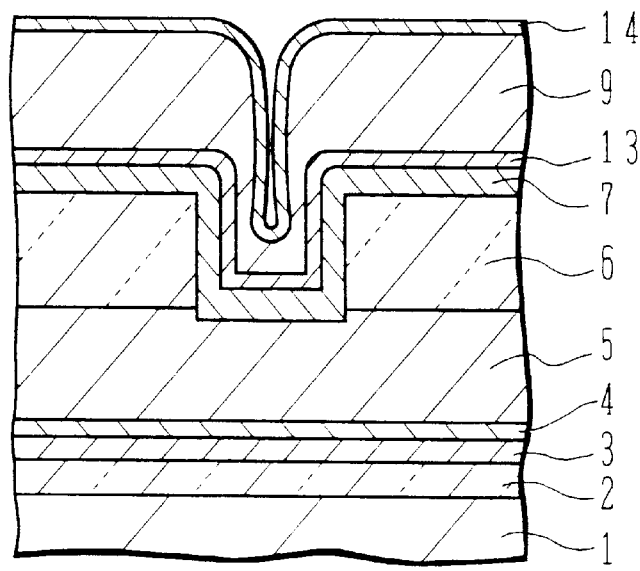
FIGS. 7A and 7B are a cross sectional view of a multi-level wiring structure according to another embodiment of the invention, and a graph showing time dependent changes in sheet resistance of upper level wiring layer when the substrate formed with the multi-level wiring structure is subjected to heat treatment.

FIG. 7A is a cross sectional view of a multi-level wiring structure according to another embodiment. On a BPSG film 2 formed on the surface of a silicon substrate 1, a lower level wiring structure and an inter-level insulating layer 6 are formed by the same methods as described with FIGS. 1A to 1D, the lower level wiring structure being constituted by three layers including a W layer 5, a TiN layer 4, and a Ti layer 3.

The exposed surface of the W layer at the bottom of a via hole is subjected to a pre-cleaning process by Ar sputtering described earlier. A TiN layer 7 of 100 nm thick is formed under the same conditions of the process described with reference to FIG. 1E. Next, a Ti layer 13 of 30 nm thick is formed at a substrate temperature of 100° C. by sputtering. An Al alloy layer 9 is formed on the Ti layer 13 under the same conditions of the process described with reference to FIG. 1F while maintaining the substrate temperature at 100° C. The substrate temperature may be set to 50 to 200° C. at the start of forming the Ti layer 13 and Al alloy layer 9.

Also with the multi-level wiring structure shown in FIG. 7A, an increase of contact resistance by reaction between W and Al can be prevented because the TiN layer 7 is formed between the W layer 5 and Al alloy layer 9. Also because the Ti layer 13 is sandwiched between the Al alloy layer 9 and TiN layer 7, an increase in electrical resistance due to electromigration in an upper level wiring can be suppressed as seen from the curve p1 of FIG. 3.

The multi-level wiring structure shown in FIG. 7A is associated with a problem of reaction between Al and Ti at the interface between the Al alloy layer 9 and Ti layer 13. If Al and Ti react with each other and form an $Al_3Ti$ alloy, the effective thickness of the Al alloy layer 9 becomes smaller and a sheet resistance increases. However, this sheet resistance increase can be suppressed by reducing the Ti concentration in the Al alloy layer 9 or by lowering the temperature of heat treatment to be performed after the Al alloy is formed.

Figure 7B:
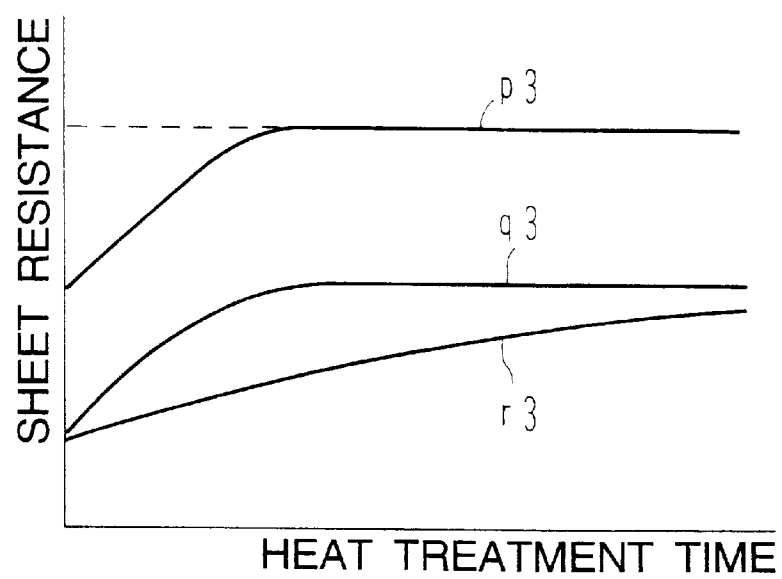
Figure 8:
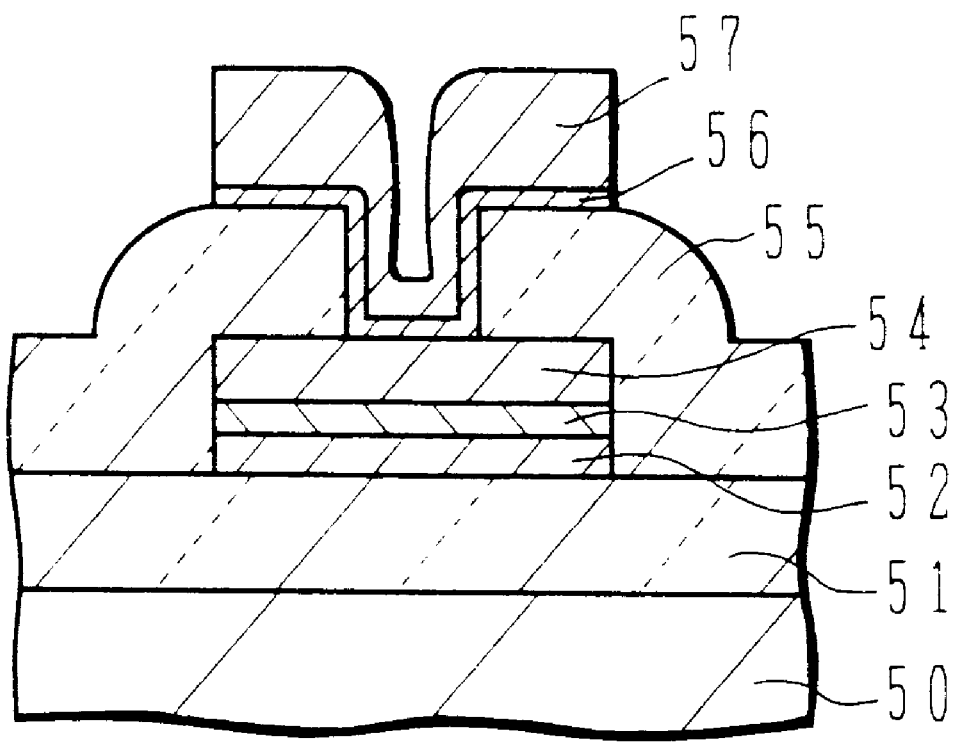
FIG. 8 is a cross sectional view of a conventional multi-level wiring structure.

FIG. 7B shows a time dependent change in sheet resistance of an upper level wiring layer. The abscissa represents a heat treatment time, and the ordinate represents a sheet resistance, respectively in arbitrary scale. A curve p3 shows a sheet resistance change when Al alloy mixed with 0.1% Cu and 0.15% Ti is used as the Al alloy layer 9, and a curve q3 shows a sheet resistance change when Al alloy mixed with 0.1% Cu and 0.05% Ti is used as the Al alloy layer 9.

In both the cases of the curves p3 and q3, as the heat treatment time lapses, the sheet resistance increases at the initial stage of the heat treatment, thereafter the sheet resistance maintains generally a constant value. A resistance increase before the sheet resistance reaches the constant value is determined by the thickness of the Ti layer 13. Although both the cases have a similar tendency of a sheet resistance change relative to a heat treatment time, the sheet resistance of the Al alloy layer with a Ti concentration of 0.05% indicated by the curve q3 is smaller than the Al alloy layer with a Ti concentration of 0.15%. This smaller resistance may be ascribed to a smaller resistivity of the Al alloy having a smaller Ti concentration. It is preferable to set the Ti concentration in the Al alloy to 0.1% or smaller in order to ensure the effects of a low Ti concentration.

A curve r3 shown in FIG. 7B shows a sheet resistance change of the Al alloy layer having the same composition as the curve q3 wherein after the Al alloy is formed, heat treatment is performed at a lower temperature. With a lower heat treatment temperature, increase of sheet resistance relative to heat treatment time becomes gentle. It is therefore possible to suppress an increase of sheet resistance by lowering the heat treatment temperature.

In order to enhance the effects of suppressing a sheet resistance increase, it is preferable to set a heat treatment temperature to 400° C. or lower after an upper level wiring is formed. For example, it is preferable to set a structure temperature, when a passivation film is deposited on an upper level wiring, to about 400° C. or lower, and/or to set a heat treatment temperature, after passivation film is etched to expose pads for connecting leads, to about 400° C. or lower.

After the Al alloy layer 9 is formed, a TiN layer 14 of 30 to 100 nm thick is formed on the Al alloy layer 9, which TiN layer is used as an anti-reflection film to exposure light used for patterning an upper level wiring layer. In this manner, the Al alloy layer 9 has such a structure that it is sandwiched between the lower barrier metal layers of Ti layer 13 and TiN layer 7 and the upper anti-reflection TiN layer 14.

The TiN layer 7 as the barrier metal layer is formed by reactive sputtering at a substrate temperature of 500° C. by using a mixed gas of Ar and $N_2$ as a work gas. In this case, a high deposition temperature is preferable in order to reduce a resistivity of the TiN layer 7. A ratio of $N_2$ gas flow rate to mixed gas flow rate is preferably 70 to 100 V %, and more preferably about 80 V %. If the $N_2$ gas flow rate ratio is set to about 80 V %, the TiN layer has an enhanced (2 0 0) orientation. With the (2 0 0) plane, large grain sizes are obtained and the surface is more planarized. Moreover, high density integration becomes easy and a resistivity is reduced.

In contrast with the above, the anti-reflection TiN layer 14 to be formed on the Al alloy layer 9 is formed by reactive sputtering at a substrate temperature of 200 to 300° C. by using a mixed gas of Ar and $N_2$ as a work gas similar to the TiN layer 7. In this case, if the $N_2$ gas flow rate ratio is set to about 80 V % similar to the TiN layer 7, nitrogen atoms react with the underlying Al layer, and AlN is formed. Therefore, contact resistance between the TiN layer 14 and Al alloy layer 9 increases. In order to prevent the formation of AlN, a ratio of $N_2$ gas flow rate to mixed gas flow rate is preferably 40 to 60 V %, and more preferably about 50 V %.

If a third level wiring structure is to be formed over the Al alloy layer 9, it can be formed by the similar method as that of forming the second level wiring structure. Specifically, on the anti-reflection TiN layer 14 of the second level wiring structure, the third level wiring structure is formed through an inter-layer insulating layer. The third level wiring may be constituted by a barrier metal layer, an Al alloy layer, and an anti-reflection TiN layer. The barrier metal layer of the third level wiring structure is required for reducing contact resistance between the second level wiring structure having the barrier metal layer and the third level wiring structure.

In the above embodiments, although W is used as refractory metal, other refractory metals such as WSi, Ta, TiN, and TiN/Ti may also be used. Although TiN is used as the barrier metal layer, other metals or metal alloys may also be used if they are materials different from, and difficult to react with, both the refractory metal which is the main composition of a lower level wiring and Al which is the main composition of an upper level wiring. For example, TiW, W, Ta, and the like may also be used.

The present invention has been described in connection with the preferred embodiments. The invention is not limited only to the above embodiments. It is apparent to those skilled in the art that various modification, improvements, combinations and the like can be made without departing from the scope of the appended claims.

What is claimed is:

1. A method of manufacturing a semiconductor device, comprising the steps of:
    forming a first wiring on a substrate having a first insulating layer on a surface thereof, said first wiring containing 90% or more refractory;
    forming a second insulating layer on said first wiring;
    forming a via hole in said second insulating layer so as to expose a surface of said first wiring;
    forming a barrier layer at least on the exposed surface of said first wiring at a bottom of said via hole, forming said barrier layer including heating surfaces of said second insulating layer and said first wiring, starting deposition of a TiN layer when a temperature of said surfaces is 50 to 200° C., and continuing deposition of said TiN layer at least on the surface of said first wiring exposed at a bottom of said via hole, while controlling a temperature of a surface of said TiN layer so as to set the temperature to 400 to 600° C. at termination of said deposition of said TiN layer, said barrier layer being made of a material different from, and not substantially reacting with, both Al and, the refractory metal;
    slightly oxidizing a surface of said barrier layer to form an oxidized surface layer;
    degassing by heating at least said barrier layer to a temperature of 250 to 500° C. for degassing gas molecules absorbed on a surface of said barrier layer; and
    forming a second wiring layer on said insulating layer and said oxidized surface layer, said second wiring layer containing 90% or more Al.

2. A method of manufacturing a semiconductor device, comprising the steps of:
    forming a first wiring on a substrate having a first insulating layer on a surface thereof, said first wiring containing 90% or more refractory;
    forming a second insulating layer on said first wiring;
    forming a via hole in said second insulating layer so as to expose a surface of said first wiring;
    forming a barrier layer at least on the exposed surface of said first wiring at a bottom of said via hole, forming said barrier layer including heating surfaces of said second insulating layer and said first wiring, starting deposition of a TiN layer when a temperature of said surfaces is 50 to 200° C., and continuing deposition of said TiN layer at least on the surface of said first wiring exposed at a bottom of said via hole, while controlling a temperature of a surface of said TiN layer so as to set the temperature to 400 to 600° C. at termination of said deposition of said TiN layer, said barrier layer being made of a material different from, and not substantially reacting with, both Al and, the refractory metal;
    slightly oxidizing a surface of said barrier layer to form an oxidized surface layer;
    degassing by heating at least said barrier layer to a temperature of 250 to 500° C. for degassing gas molecules absorbed on a surface of said barrier layer; and
    forming a second wiring layer on said insulating layer and said oxidized surface layer, said second wiring layer containing 90% or more Al.

3. A method of manufacturing a semiconductor device, comprising the steps of:
    forming a first wiring on an insulating surface, said first wiring containing 90% or more refractory;
    forming an insulating layer on said first wiring;
    forming a via hole in said insulating layer so as to expose a surface of said first wiring;
    forming a barrier layer at least on the exposed surface of said first wiring at a bottom of said via hole, forming said barrier layer including heating surfaces of said second insulating layer and said first wiring, starting deposition of a TiN layer when a temperature of said surfaces is 50 to 200° C., and continuing deposition of said TiN layer at least on the surface of said first wiring exposed at a bottom of said via hole, while controlling a temperature of a surface of said TiN layer so as to set the temperature to 400 to 600° C. at termination of said deposition of said TiN layer;
    slightly oxidizing a surface of said barrier layer to form an oxidized surface layer;
    forming a Ti layer at least on a surface of said barrier length;
    degassing by heating at least said barrier layer to a temperature of 250 to 500° C. for degassing gas molecules absorbed on a surface of said barrier layer; and
    forming a second wiring layer on said insulating layer and said Ti layer, said second wiring layer having a Ti concentration of 0.1% or smaller.

4. A method of manufacturing a semiconductor device, comprising the steps of:
    forming a first wiring on an insulating surface, said first wiring containing 90% or more refractory;
    forming an insulating layer on said first wiring;
    forming a via hole in said insulating layer so as to expose a surface of said first wiring;
    forming a Ti layer at least on the surface of said first wiring exposed at a bottom of said via hole;
    forming a barrier layer at least on a surface of said Ti layer forming said barrier layer including heating surfaces of said second insulating layer and said first wiring, starting deposition of a TiN layer when a temperature of said surfaces is 50 to 200° C., and continuing deposition of said TiN layer at least on the surface of said first wiring exposed at a bottom of said via hole, while controlling a temperature of a surface of said TiN layer so as to set the temperature to 400 to 600° C. at termination of said deposition of said TiN layer;
    slightly oxidizing a surface of said barrier layer to form an oxidized surface layer;
    degassing by heating at least said barrier layer to a temperature of 250 to 500° C. for degassing gas molecules absorbed on a surface of said barrier layer; and
    forming a second wiring layer on said insulating layer and said barrier layer, said second wiring layer containing 90% or more Al.

5. A method of manufacturing a semiconductor device, comprising the steps of:
    forming a first wiring on a surface of a first insulating layer on an Si substrate, said first wiring containing 90% or more refractory metal;
    forming a second insulating layer on said first wiring;
    forming a via hole in said second insulating layer so as to expose a surface of said first wiring;
    forming a barrier layer at least on the exposed surface of said first wiring at a bottom of said via hole, said barrier layer being made of a material different from, and not substantially reacting with, both Al and, the refractory metal;

slightly oxidizing a surface of said barrier layer to form an oxidized surface layer; and forming a second wiring layer on said second insulating film and said oxidized surface layer, said second wiring layer containing 90% or more of Al.

6. A method according to claim 5, wherein said step of forming a barrier layer includes heating surfaces of said second insulating layer and said first wiring, starting deposition of a TiN layer when a temperature of said surfaces is 50 to 200° C., and continuing deposition of said TiN layer at least on the surface of said first wiring exposed at a bottom of said via hole, while controlling a temperature of a surface of said TiN layer so as to set the temperature to 400 to 600° C. at termination of said deposition of said TiN layer.

7. A method according to claim 5, further comprising a step of etching the exposed surface of said first wiring at the bottom of said via hole and a surface of said second insulating layer by a thickness of 30 to 50 nm by sputter etching using Ar, after said step of forming a via hole and before said step of forming a barrier layer.

8. A method according to claim 7, wherein said step of forming a barrier layer includes heating surfaces of said second insulating layer and said first wiring, starting deposition of a TiN layer when a temperature of said surfaces is 50 to 200° C., and continuing deposition of said TiN layer at least on the surface of said first wiring exposed at a bottom of said via hole, while controlling a temperature of a surface of said TiN layer so as to set the temperature to 400 to 600° C. at termination of said deposition of said TiN layer.

9. A method according to claim 5, wherein said step of slightly oxidizing a surface of said barrier layer is performed by annealing in a nitrogen atmosphere.

10. A method according to claim 5, further comprising a step of forming a TiN layer on a surface of said second wiring layer by reactive sputtering using a mixed gas of Ar and $N_2$ as a work gas, under a condition of a $N_2$ gas flow rate relative to a mixed gas flow rate at 40 to 60 V %.

11. A method according to claim 5, further comprising the steps of:

partially etching said second wiring layer to form a patterned second wiring; and forming a passivation film on said second patterned wiring at a temperature of 400° C. or lower.

12. A method of manufacturing a semiconductor device comprising the steps of:

forming a first wiring on a surface of a first insulating layer on an Si substrate, said first wiring containing 90% or more refractory metal;

forming a second insulating layer on said first wiring;

forming a via hole in said second insulating layer so as to expose a surface of said first wiring;

forming a barrier layer at least on the exposed surface of said first wiring at a bottom of said via hole, said barrier layer being made of a material different from, and not substantially reacting with, both Al and, the refractory metal;

slightly oxidizing a surface of said barrier layer to form an oxidized surface layer; and forming a second wiring layer on said second insulating film and said oxidized surface layer, said second wiring layer containing Al as a main composition thereof; and degassing by heating at least said barrier layer to a temperature of 250 to 500° C. for degassing gas molecules absorbed on a surface of said barrier layer, after said step of slightly oxidizing a surface of said barrier layer and before said step of forming a second wiring layer.

13. A method according to claim 12, wherein degassing by heating step is performed in a vacuum atmosphere, and step of forming a second wiring layer is successively performed in the same vacuum atmosphere.

14. A method according to claim 12, wherein degassing by heating step applies heated gas to a bottom surface of substrate.

15. A method according to claim 14, wherein degassing by heating step is performed in an evacuated chamber and heated gas has a pressure of 1 to 20 Torr.

16. A method according to claim 12, wherein said step of forming a second wiring layer forms said second wiring layer while setting a temperature of the surface of said barrier layer to 300 to 400° C.

17. A method according to claim 16, further comprising a step of cooling said substrate to 50 to 200° C. before said step of forming a second wiring layer.

18. A method of manufacturing a semiconductor device, comprising the steps of:

forming a first wiring on an insulating surface, said first wiring containing 90% or more refractory metal;

forming an insulating layer on said first wiring;

forming a via hole in said insulating layer so as to expose a surface of said first wiring;

forming a barrier layer at least on the exposed surface of said first wiring at a bottom of said via hole;

slightly oxidizing a surface of said barrier layer to form an oxidized surface layer;

forming a Ti layer at least on a surface of said barrier layer;

degassing by heating at least said barrier layer to a temperature of 250 to 500° C. for degassing gas molecules absorbed on a surface of said barrier layer; and forming a second wiring layer on said insulating layer and said Ti layer, said second wiring layer having a Ti concentration of 0.1% or smaller.

19. A method according to claim 18, wherein said step of forming a Ti layer forms said Ti layer while setting a surface temperature of said first wiring to 50 to 200° C., and said step of forming a second wiring layer forms said second wiring at a same temperature as said Ti layer forming step.

20. A method according to claim 18, wherein said step of forming a barrier layer comprises reactive sputtering in an atmosphere containing $N_2$ of 70 to 100 V %.

21. A method according to claim 20, further comprising a step of sputtering a TiN layer on said second wiring layer.

22. A method according to claim 21, wherein said step of sputtering a TiN layer comprises reactive sputtering in an atmosphere containing $N_2$ of 40 to 60 V %.

23. A method of manufacturing a semiconductor device, comprising the steps of:

forming a first wiring on an insulating surface, said first wiring containing 90% or more refractory metal;

forming an insulating layer on said first wiring;

forming a via hole in said insulating layer so as to expose a surface of said first wiring;

forming a Ti layer at least on the surface of said first wiring exposed at a bottom of said via hole;

forming barrier layer at least on a surface of said Ti layer;

slightly oxidizing a surface of said barrier layer to form an oxidized surface layer;

degassing by heating at least said barrier layer to a temperature of 250 to 500° C. for degassing gas molecules absorbed on a surface of said barrier layer; and forming a second wiring layer on said insulating layer and said barrier layer, said second wiring layer containing 90% or more Al.

24. A method according to claim 23, wherein said step of forming a barrier layer performs reactive sputtering at a substrate temperature of 200 to 400° C. in a nitrogen-containing atmosphere.

* * * * *